(12) United States Patent
Lin et al.

(10) Patent No.: US 8,208,331 B2
(45) Date of Patent: Jun. 26, 2012

(54) METHOD FOR ASYMMETRIC SENSE AMPLIFIER

(75) Inventors: Shu-Hsuan Lin, Danshuei Township (TW); Yi-Tzu Chen, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/224,942

(22) Filed: Sep. 2, 2011

(65) Prior Publication Data

US 2011/0317506 A1    Dec. 29, 2011

Related U.S. Application Data

(63) Continuation of application No. 12/347,867, filed on Dec. 31, 2008, now Pat. No. 8,027,214.

(51) Int. Cl.
*G11C 7/02* (2006.01)

(52) U.S. Cl. ........ 365/207; 365/196; 365/154; 365/203; 365/189.11

(58) Field of Classification Search .................. 365/207, 365/196, 154, 203, 189.11
See application file for complete search history.

(56) References Cited

U.S. PATENT DOCUMENTS

| | | | |
|---|---|---|---|
| 5,949,256 A * | 9/1999 | Zhang et al. | 327/57 |
| 7,099,218 B2 | 8/2006 | Wicht et al. | |
| 7,251,178 B2 | 7/2007 | Gogl et al. | |
| 7,394,699 B2 | 7/2008 | Vali et al. | |

OTHER PUBLICATIONS

Gray, K. S., "Cross-Coupled Charge-Transfer Sense Amplifier and Latch Sense Scheme for High-Density FET Memories," May 1980, pp. 283-290, vol. 24, No. 3, IBM Journal of Research and Development.
Huang, H., et al.., "Unbalanced Current Latch Sense Amplifier for Low-Power High-Speed PLD'S," Computer & Communication Research Laboratories, 1996, pp. 193-196, IEEE.
Wijetunga, P., et al., "3.3 GHz Sense-Amplifier in 0.18 μm CMOS Technology," Advanced Interconnected and Network Technology, 2002, pp. 764-767, IEEE.
Verma, N., et al., "A 256 kb 65 nm 8T Subthreshhold SRAM Employing Sense-Amplifier Redundancy," Journal of Solid-State Circuits, Jan. 2008, pp. 141-149, vol. 43, No. 1, IEEE.

* cited by examiner

*Primary Examiner* — Thong Q Le
(74) *Attorney, Agent, or Firm* — Slater & Matsil, L.L.P.

(57) ABSTRACT

Methods for determining the state of memory cells include using an asymmetric sense amplifier. The methods include sensing the voltages on bit line (BL) and bit line bar (BLB) signals by coupling the BL to a first output node of an imbalanced cross-coupled latch (ICL), the ICL outputting a logic low value if the a difference between the a voltage on the BL and a voltage on the BLB exceeds a threshold. Sensing the voltages includes providing at least a first and a second pull down field effect transistor (FET) each having a channel coupled between the first and second output nodes and a ground node, respectively, in a cross coupled arrangement, wherein the second pull down FET has a channel width that is greater than a channel width of the first pull down FET. Additional methods are disclosed.

17 Claims, 8 Drawing Sheets

| δV (VOLTS) | CHANNEL WIDTH (μm) | | | | | | | | |
|---|---|---|---|---|---|---|---|---|---|
| | 1.1 | 1.2 | 1.3 | 1.4 | 1.5 | 2.0 | 2.5 | 3.0 | 3.5 |
| 9E-02 | PASS | PASS | PASS | PASS | PASS | PASS | PASS | PASS | PASS |
| 8E-02 | PASS | PASS | PASS | PASS | PASS | PASS | PASS | PASS | PASS |
| 7E-02 | PASS | PASS | PASS | PASS | PASS | PASS | PASS | PASS | 0 FAIL |
| 6E-02 | PASS | PASS | PASS | PASS | PASS | PASS | 0 FAIL | 0 FAIL | 0 FAIL |
| 5E-02 | PASS | PASS | PASS | PASS | PASS | 0 FAIL | 0 FAIL | 0 FAIL | 0 FAIL |
| 4E-02 | PASS | PASS | PASS | PASS | 0 FAIL | 0 FAIL | 0 FAIL | 0 FAIL | 0 FAIL |
| 3E-02 | PASS | PASS | PASS | PASS | 0 FAIL | 0 FAIL | 0 FAIL | 0 FAIL | 0 FAIL |
| 2E-02 | PASS | PASS | 0 FAIL | 0 FAIL | 0 FAIL | 0 FAIL | 0 FAIL | 0 FAIL | 0 FAIL |
| 1E-02 | PASS | 0 FAIL | 0 FAIL | 0 FAIL | 0 FAIL | 0 FAIL | 0 FAIL | 0 FAIL | 0 FAIL |
| 5E-03 | 0 FAIL | 0 FAIL | 0 FAIL | 0 FAIL | 0 FAIL | 0 FAIL | 0 FAIL | 0 FAIL | 0 FAIL |

*Fig. 5a*

| δV (VOLTS) | CHANNEL WIDTH (nm) | | | | |
|---|---|---|---|---|---|
| | 400 | 450 | 500 | 550 | 600 |
| 8E-02 | PASS | PASS | PASS | PASS | PASS |
| 7.5E-02 | PASS | PASS | PASS | PASS | PASS |
| 7E-02 | PASS | PASS | PASS | PASS | PASS |
| 6.5E-02 | PASS | PASS | PASS | PASS | PASS |
| 6E-02 | PASS | PASS | PASS | PASS | PASS |
| 5.5E-02 | PASS | PASS | PASS | PASS | PASS |
| 5E-02 | PASS | PASS | PASS | PASS | PASS |
| 4.5E-02 | PASS | PASS | PASS | PASS | PASS |
| 4E-02 | 0 FAIL | PASS | PASS | PASS | PASS |
| 3.5E-02 | 0 FAIL | PASS | PASS | PASS | PASS |
| 3E-02 | 0 FAIL | 0 FAIL | PASS | PASS | PASS |
| 2.5E-02 | 0 FAIL | 0 FAIL | PASS | PASS | PASS |
| 2E-02 | 0 FAIL | 0 FAIL | 0 FAIL | PASS | PASS |
| 1.5E-02 | 0 FAIL | 0 FAIL | 0 FAIL | PASS | PASS |
| 1E-02 | 0 FAIL | 0 FAIL | 0 FAIL | 0 FAIL | PASS |
| 5E-03 | 0 FAIL | 0 FAIL | 0 FAIL | 0 FAIL | PASS |
| 2.5E-03 | 0 FAIL | 0 FAIL | 0 FAIL | 0 FAIL | 0 FAIL |

*Fig. 5b*

| TYPE | TRANSISTOR GEOMETRY | | SENSE AMP OFFSET VOLTAGE | | |
|---|---|---|---|---|---|
| | WIDTH OF TRANS 232 | WIDTH OF TRANS 212 | STD-DEV | MEAN | 6*STD-DEV |
| DIFFERENTIAL SYMMETRIC | 1 um | 520 nm | 9.3153 mV | 1.26709 mV | 55.892 mV |
| SINGLE-ENDED ASYMMETRIC | 12 um | 520 nm | 11.32242 mV | 19.6357 mV | 67.945 mV |
| SINGLE-ENDED ASYMMETRIC | 12 um | 620 nm | 9.1425 mV | 12.3721 mV | 54.855 mV |

Fig. 6

# METHOD FOR ASYMMETRIC SENSE AMPLIFIER

This application is a continuation of U.S. patent application Ser. No. 12/347,867, filed on Dec. 31, 2008, entitled "Asymmetric Sense Amplifier," which application is hereby incorporated herein by reference in its entirety.

TECHNICAL FIELD

The present invention relates generally to semiconductor memory devices, and more particularly to sensing circuits for determining the state of memory cells.

BACKGROUND

Semiconductors are used in integrated circuits for a wide range of applications, including personal computers, music devices, video devices, multimedia devices, digital data devices, communications devices, and so forth. One type of semiconductor device used in a number of such applications is a semiconductor storage device, such as a static random access memory (SRAM), dynamic RAM (DRAM), read-only memory (ROM), flash memory, and so forth.

Semiconductor storage devices allow for the storage of large amounts of data, with ROMs being non-volatile and enabling the storage of information that persists without requiring power. RAMs, on the other hand, allow rapid and random access to information stored therein, but are volatile, requiring power, constant, periodic updates, or both to maintain information integrity.

Semiconductor storage devices are generally arranged in large two-dimensional arrays of individual memory cells. Each row of memory cells may be selected by a row select line (also commonly referred to as a word line) and each column of memory cells may be selected by a column select line (commonly referred to as a bit line). A memory cell at an intersection of an active word line and an active bit line may have information written to it or read from it.

Reading information from a memory cell or writing information to a memory cell may be performed by a sense amplifier. For example, a sense amplifier may read information from a memory cell by detecting a change in a voltage or a current on a bit line coupled to the memory cell (the memory cell being a memory cell located at the intersection of the active word line and bit line).

Since, in general, a wide voltage swing (or wide current swing) may take longer to occur than a small voltage swing (or small current swing), a sense amplifier that may be able to accurately determine the information stored in the memory cell using a small voltage swing is desirable. By being able to utilize a small voltage swing, the sense amplifier may be able to shorten memory access times, thereby improving the performance of the semiconductor storage device. The small voltage swing becomes more critical as the two-dimensional array of memory cells becomes larger with more and more memory cells being attached to each word line and bit line, thereby increasing a capacitive load on the lines. The increased capacitive load slows the voltage swing.

FIG. 1a shows a prior art sense amplifier 100. Sense amplifier 100 makes use of a NAND logic gate 105 to determine the information stored in a memory cell. The use of NAND logic gate 105 may result in a high threshold voltage, often greater than 100 mV (commonly on the order of 300 to 400 mV). This may significantly impact the speed performance of sense amplifier 100, especially as the number of memory cells increase.

FIG. 1b shows a prior art single-ended symmetrical differential sense amplifier 150. Sense amplifier 150 makes use of a cross-coupled latch 155 to determine the information stored in a memory cell. Additionally, sense amplifier 150 includes a pair of transistors (transistor 160 and transistor 162) for use as pass gates, preferably field effect transistors (FET) are used, especially N-type metal oxide semiconductor (NMOS) transistors. Gate terminals of the transistors 160 and 162 may be coupled to an enable signal "PGENB," which may be used to turn the transistors 160 and 162 on or off.

Transistor 160 may be used to couple or de-couple a bitline "BL" input into cross-coupled latch 155, while transistor may be used to couple or decouple a reference voltage "VREF" into cross-coupled latch 155. The reference voltage is not a readily available voltage, such as VDD, substrate ground, and so forth. Sense amplifier 150 determines the information stored in the memory cell from the voltage of the reference voltage and the voltage on the bit line. However, the use of a reference voltage that is not one of the commonly available voltages may require the use of an additional voltage supply and/or the use of an external voltage supply connected to a semiconductor storage device containing sense amplifier 150.

BRIEF DESCRIPTION OF THE DRAWINGS

For a more complete understanding of the embodiments, and the advantages thereof, reference is now made to the following descriptions taken in conjunction with the accompanying drawings, in which:

FIG. 5a is a table of zero (0) detection by an asymmetric sense amplifier for various sensing voltages and channel widths of a pull down transistor;

FIG. 5b is a table of zero (0) detection by an asymmetric sense amplifier for various sensing voltages and channel widths of a gate transistor;

FIG. 6 is a table of multiple sense amplifier offset voltage values for several different sense amplifier configurations;

DETAILED DESCRIPTION OF ILLUSTRATIVE EMBODIMENTS

The making and using of the embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The embodiments will be described in a specific context, namely a single-ended sense amplifier for use with SRAM semiconductor storage devices. The invention may also be applied, however, to sense amplifiers for other types of semiconductor storage devices, including ROMs, DRAM, flash memories, and so forth.

Figure 2A:
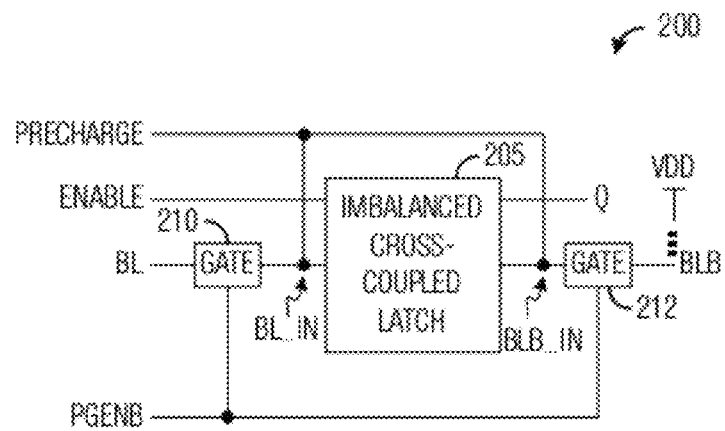
FIG. 2a is a block diagram of an asymmetric sense amplifier.

FIG. 2a shows a block diagram of an asymmetric sense amplifier 200. Asymmetric sense amplifier 200 may be used to determine information stored in semiconductor storage devices, such as SRAMs, DRAMs, ROMs, flash memories, and so forth. Asymmetric sense amplifier 200 includes an imbalanced cross-coupled latch 205 that may be used to determine a difference between data inputs coupled to bit line (BL) and bit line bar (BLB) of a memory cell and to generate an output (Q) (or an output bar (QB)) representing the information (or inverted information) stored in the memory cell. However, since asymmetric sense amplifier 200 is a single-ended sense amplifier, one of the data inputs of imbalanced cross-coupled latch 205, for example, data input coupled to BLB, may be tied to a voltage supply. According to an embodiment, the data input coupled to BLB may be tied to VDD. In alternative embodiments, the data input coupled to BLB may be tied to substrate ground or some other voltage supply available in the semiconductor storage device. In general, asymmetric sense amplifier 200 does not require a separate voltage supply that provides a reference voltage unused elsewhere in the semiconductor storage device. Rather, a voltage supply already available in the semiconductor storage device is used, thereby reducing hardware requirements and complexity.

A pair of gates (gate 210 and gate 212) may be used to control the propagation of BL and BLB into (and also out of) imbalanced cross-coupled latch 205. The pair of gates may be controlled by a single enable control signal "PGENB." Alternatively, the gates may be controlled by separate enable control signals, such as PGENB1 and PGENB2, for example. As shown in FIG. 2a, gate 210 controls the propagation of signal BL into imbalanced cross-coupled latch 205 and gate 212 controls the propagation of signal BLB into imbalanced cross-coupled latch 205. On the side of gates 210 and 212 closer to imbalanced cross-coupled latch 205, the signals BL and BLB may be referred to as BL_IN and BLB_IN, respectively. In addition to representing signal names, BL_IN and BLB_IN may also be used to name corresponding electrical nodes for use in discussion.

Additionally, imbalanced cross-coupled latch 205 may be enabled (i.e., permitted to operate) by an enable control signal "ENABLE," while precharging (and equalizing) of signal lines carrying the data inputs may be controlled by a control signal "PRECHARGE." The PRECHARGE control signal allows the data inputs to be brought to a specified voltage potential prior to a determining of information stored in a memory cell is performed. For example, the PRECHARGE control signal may bring both data inputs to VDD.

Figure 2B:
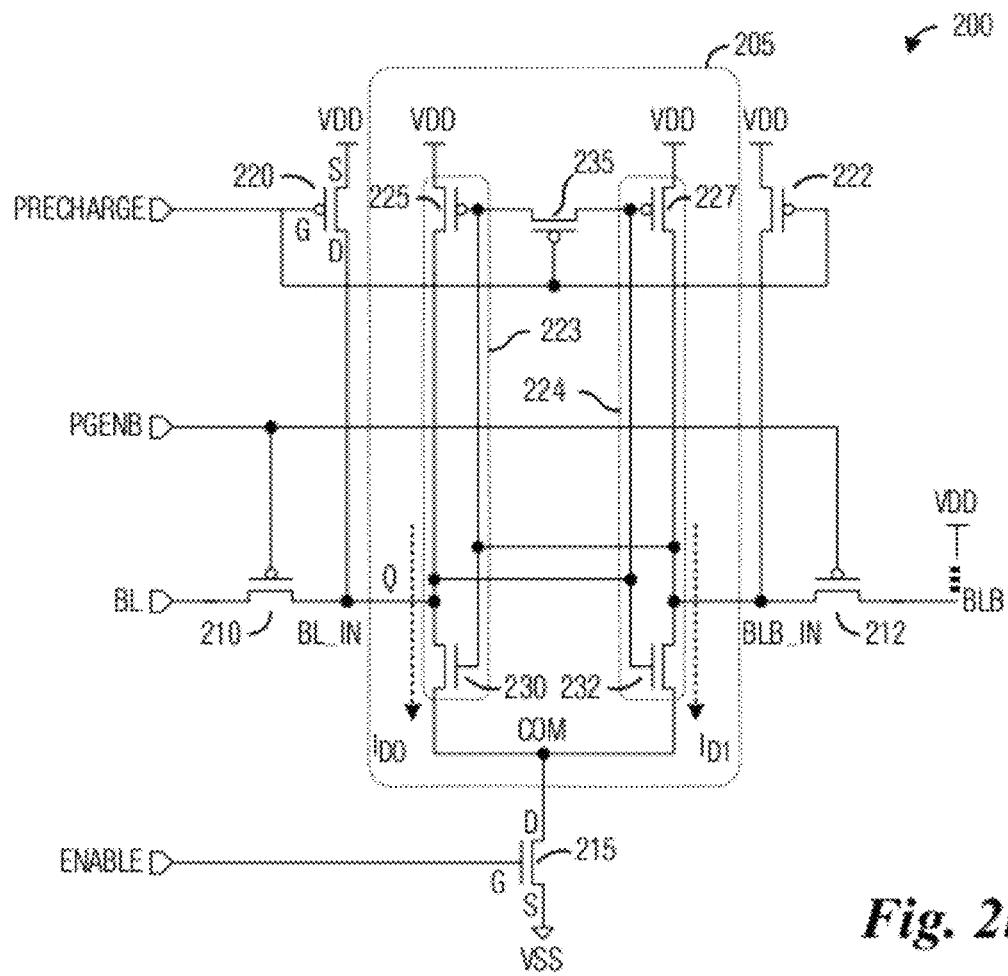
FIG. 2b is a detailed diagram of an asymmetric sense amplifier.

FIG. 2b shows a detailed view of asymmetric sense amplifier 200. Gates 210 and 212 may be implemented using single transistors, for example, FETs, preferably PMOS transistors, with their gate terminals coupled to the PGENB control signal, as shown in FIG. 2b. Similarly, a transistor 215 (a FET, such as an N-type metal oxide semiconductor (NMOS) transistor, for example) may be used to enable operation of asymmetric sense amplifier 200 by establishing or breaking a current path depending on the ENABLE control signal. Transistors 220 and 222 may be used to precharge and equalize the data inputs to VDD. Transistors 220 and 222 may be implemented using FETs, such as PMOS transistors with their gate terminals coupled to the PRECHARGE control signal. Alternatively, NMOS transistors may be used in place of the PMOS transistors.

Imbalanced cross-coupled latch 205 includes two cross-coupled inverters (a first inverter 223 and a second inverter 224) with each inverter comprising FETs, such as an NMOS transistor and a PMOS transistor coupled serially. First inverter 223 includes PMOS transistor 225 and NMOS transistor 230, with a source terminal of PMOS transistor 225 coupled to VDD, a source terminal of NMOS transistor 230 coupled to transistor 215, and drain terminals of PMOS transistor 225 and NMOS transistor 230 coupled together. Second inverter 224 includes FETs, such as PMOS transistor 227 and NMOS transistor 232, with a source terminal of PMOS transistor 227 coupled to VDD, a source terminal of NMOS transistor 232 coupled to transistor 215, and drain terminals of PMOS transistor 225 and NMOS transistor 230 coupled together. Transistor 235, also an FET, preferably a PMOS transistor, may be used to couple the gates of PMOS transistor 225, PMOS transistor 227, NMOS transistor 230, and NMOS transistor 232 together when the PRECHARGE control signal is asserted, effectively equalizing them and outputs of asymmetric sense amplifier 200.

Although shown as single transistors, NMOS transistor 230 and NMOS transistor 232 may be implemented as multiple NMOS transistors arranged in parallel. In general, using multiple transistors in parallel may help to increase the current handling capabilities of the transistors. Similarly, PMOS transistor 225 and PMOS transistor 227 may be implemented as multiple PMOS transistors arranged in parallel, and transistors 210 and 212 may also be implemented as multiple PMOS transistors arranged in parallel.

The cross-coupling of the two inverters includes the drain terminals of PMOS transistor 225 and NMOS transistor 230 (output of first inverter 223 and also electrical node BL_IN) coupled to gate terminals of PMOS transistor 227 and NMOS transistor 232 (input of second inverter 224), while drain terminals of PMOS transistor 227 and NMOS transistor 232 (output of second inverter 224 and also electrical node BLB_IN) are coupled to gate terminals of PMOS transistor 225 and NMOS transistor 230 (input of first inverter 223). Additionally, the source and drain terminals of PMOS transistor 235 may be coupled to the inputs of first inverter 223 and second inverter 224, while its gate terminal may be coupled to the PRECHARGE control signal. The output (Q) of asymmetric sense amplifier 200 may be taken at electrical node BL_IN (output of first inverter 223), while the output bar (QB) may be taken at electrical node BLB_IN (output of second inverter 224). The output of asymmetric sense amplifier 200 may be latched or buffered to retain its value for subsequent use.

Depending on a difference (if any) in voltage potential at electrical nodes BL_IN and BLB_IN, when transistor 215 is turned on by the ENABLE control signal, either electrical node BL_IN or BLB_IN is pulled to VSS while the other is pulled to VDD. For example, if electrical node BL_IN is at a lower voltage potential than BLB_IN by more than a sensing voltage ($\delta V$), then electrical node BL_IN may be pulled to VSS by NMOS transistor 230, while BLB_IN is pulled to VDD by PMOS transistor 227 when transistor 215 is turned on. While, if electrical nodes BL_IN and BLB_IN are at about the same voltage potential, then electrical node BL_IN may be pulled to VDD and BLB_IN may be pulled to VSS.

Figure 3:
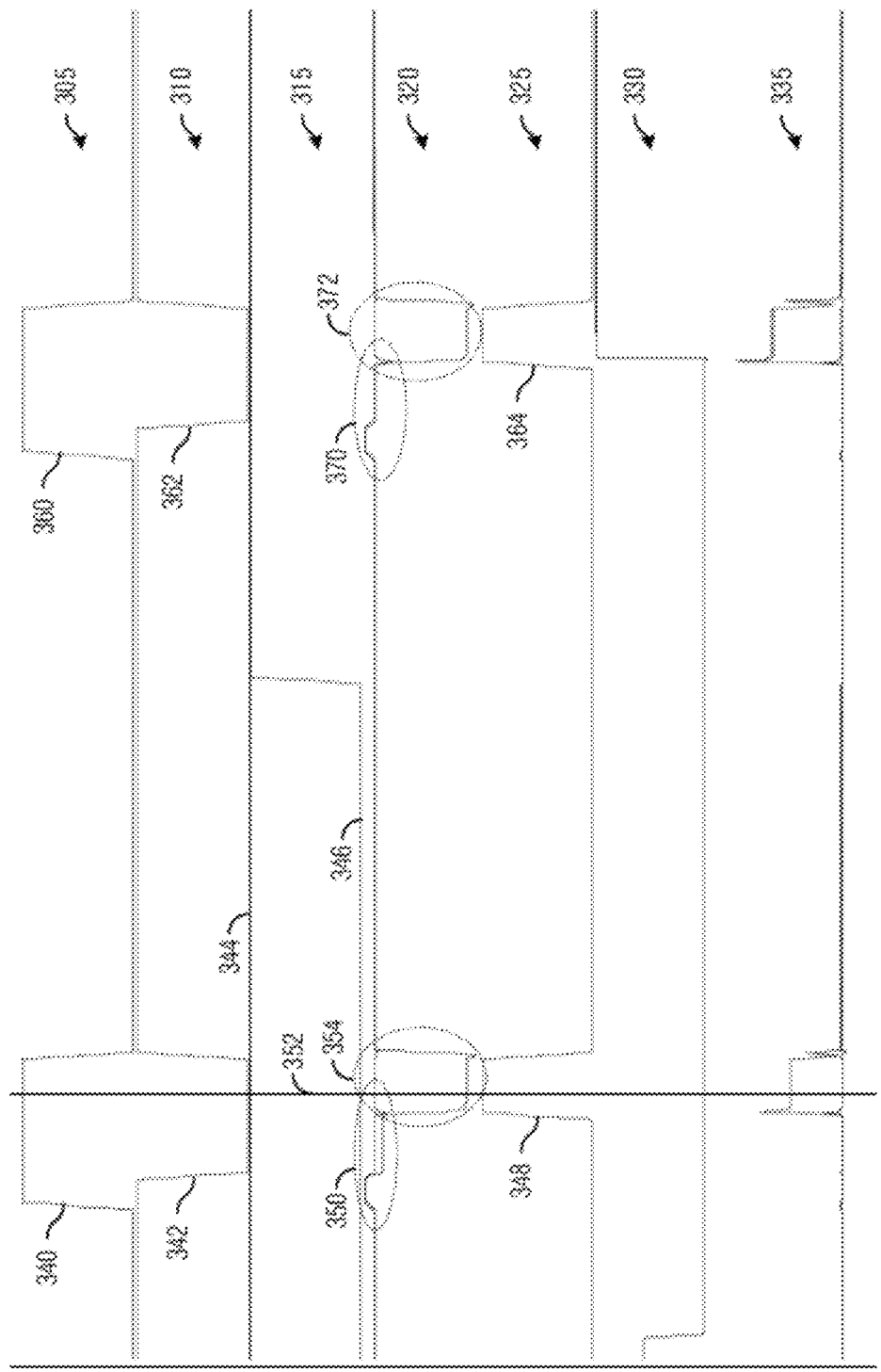
FIG. 3 is a timing diagram of an asymmetric sense amplifier.

FIG. 3 shows a series of signal traces, illustrating the operation of asymmetric sense amplifier 200. A first trace 305 illustrates the PRECHARGE control signal, a second trace 310 illustrates the PGENB control signal (which may be an inverse of a PGEN control signal), and a third trace 315 illustrates an overlay of the BL and the BLB signals. The overlay of the BL and the BLB signals allows for a comparison of the two signals. A fourth trace 320 illustrates an overlay of the BL_IN and BLB_IN electrical nodes, a fifth trace 325 illustrates the ENABLE control signal, and a sixth trace 330 illustrates the output (Q) of asymmetric sense amplifier 200. Finally, a seventh trace 335 illustrates currents flowing through NMOS transistors 230 and 232.

Prior to asymmetric sense amplifier 200 determining information stored in a memory cell, it may be necessary to precharge the data inputs of asymmetric sense amplifier 200. This may be accomplished by turning on transistors 220, 222, and 235 to couple the data inputs to VDD and to equalize the data inputs, for example. An instance of the assertion of the PRECHARGE control signal is shown as pulse 340 in first trace 305. After the data inputs have been allowed to precharge and equalize, the signals BL (coupled to a data output of a memory cell, for example) and BLB (coupled to VDD, for example) may be allowed to propagate to asymmetric sense amplifier 200 by turning on PMOS transistors 210 and 212. An instance of this is shown as a drop 342 in second trace 310.

Figure 4A:
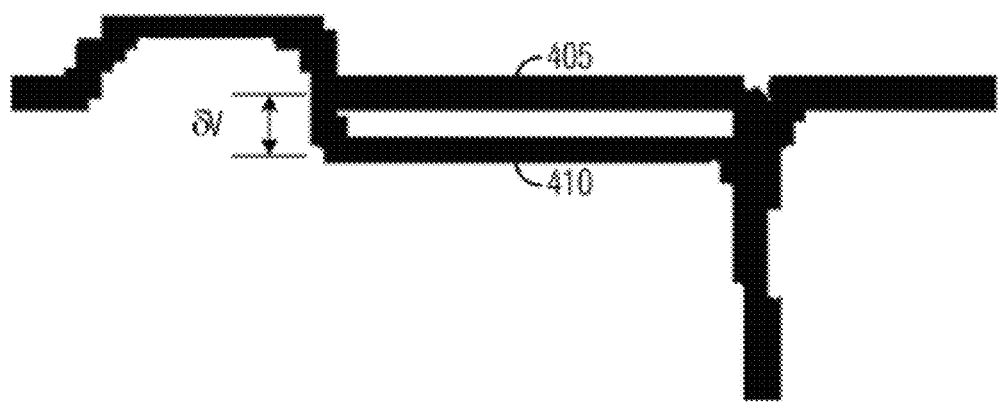
FIGS. 4a and 4b are detailed timing diagrams of an asymmetric sense amplifier.

Third trace 315 displays the values of the signals BL and BLB, which are low for BL (shown as level 346) and high for BLB (shown as level 344) when the memory cell being sensed is storing a zero (0). The signal BLB may always remain high since it is tied to VDD. Fourth trace 320 displays the values of the electrical nodes BL_IN and BLB_IN. When the PRECHARGE control signal is asserted (pulse 340, for example), the values of the electrical nodes BL_IN and BLB_IN increases slightly and then drops once the PGENB control signal is asserted (dip 342, for example). With the PGENB control signal asserted, electrical node BLB_IN may be pulled back down to VDD by signal BLB (which is tied to VDD) and electrical node BL_IN may be pulled down to VDD−δV by signal BL (which has the low value at this point). FIG. 4a illustrates a detailed view of fourth trace 320 within highlight 350, with trace 405 illustrates electrical node BLB_IN and trace 410 illustrates electrical node BL_IN.

A current labeled "$I_{D0}$" flowing through NMOS transistor 230 may be expressed as:

$$I_{D0} = \frac{1}{2}\mu_n \cdot C_{OX} \cdot \left(\frac{W}{L}\right)_0 \cdot (V_{GS0} - V_{THN0})^2,$$

where $\mu_n$ is the charge carrier mobility, $C_{ox}$ is the gate oxide capacitance, W and L are channel width and channel length of NMOS transistor 230, $V_{GS0}$ is the gate-source voltage, and $V_{THN0}$ is the threshold voltage. Similarly, a current labeled "$I_{D1}$" flowing through NMOS transistor 232 may be expressed as:

$$I_{D1} = \frac{1}{2}\mu_n \cdot C_{OX} \cdot \left(\frac{W}{L}\right)_1 \cdot (V_{GS1} - V_{THN1})^2.$$

When sensing a one (1), electrical node BL_IN is equal to about VDD, this means that $I_{D0} < I_{D1}$. When sensing a zero (0), electrical node BL_IN is equal to about VDD−δV, this means that $I_{D0} > I_{D1}$. In other words, when sensing a one (1), a ratio of $I_{D1}$ to $I_{D0}$, which may be expressible as:

$$\frac{I_{D1}}{I_{D0}} = \frac{(W/L)_1(V_{DL\_IN} - V_{COM} - V_{THN1})^2}{(W/L)_0(V_{DLB\_IN} - V_{COM} - V_{THN0})^2}, \quad (1)$$

where $V_{COM}$ is voltage at electrical node COM. The ratio of $I_{D1}$ to $I_{D0}$ is greater than one when sensing a one (1), while when sensing a zero (0), the ratio of $I_{D1}$ to $I_{D0}$ is less than one.

Referring back to FIG. 3, a period of time after the PGENB control signal has been asserted, and after the electrical nodes BL_IN and BLB_IN have stabilized, the ENABLE control signal may be asserted (shown as pulse 348, for example). The difference in the electrical nodes BL_IN (at about VDD−δV) and BLB_IN (at about VDD) when the ENABLE control signal is asserted may result in electrical node BL_IN being pulled to VSS by NMOS transistor 230 and electrical node BLB_IN being pulled to VDD by PMOS transistor 227. The electrical nodes BL_IN and/or BLB_IN may then be latched to generate the output of asymmetric sense amplifier 200. For example, the latching of the electrical nodes BL_IN and/or BLB_IN may occur while asymmetric sense amplifier 200 is enabled, such as at time highlighted by vertical line 352. Since a latched version of electrical node BL_IN is the output of asymmetric sense amplifier 200, the output of asymmetric sense amplifier 200 remains at a low value even as electrical node BL_IN subsequently changes value. A portion 354 of fourth trace 320 illustrates electrical nodes BL_IN and BLB_IN being pulled to VSS and VDD, respectively.

Figure 4B:
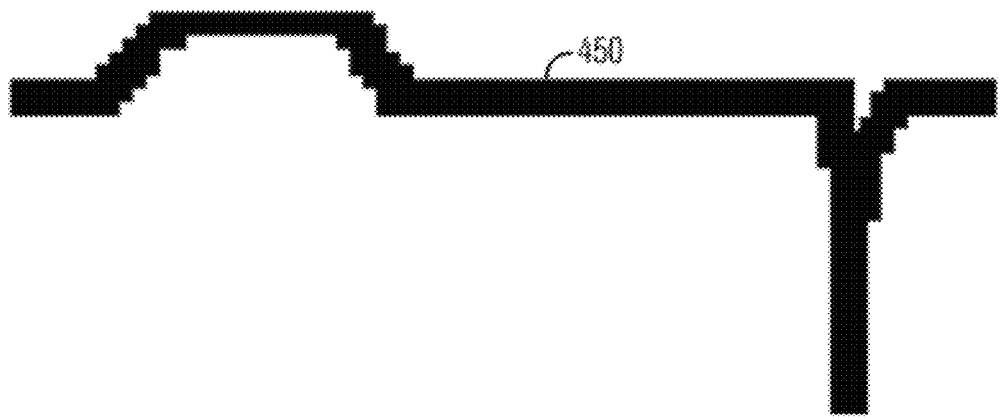

As shown in a later portion of FIG. 3, the signal BL (third trace 315) changes from the low value to the high value (the signal BLB remains at the high value since it is tied to VDD). Then after the PRECHARGE control signal is asserted (pulse 360, for example), fourth trace 320 shows that both electrical nodes BL_IN and BLB_IN are pulled up slightly by being tied to VDD. Then, after the PGENB control signal is asserted (dip 362, for example), fourth trace 320 shows that both electrical nodes BL_IN and BLB_IN are pulled back down to VDD. Since there is substantially no difference between electrical nodes BL_IN (at about VDD) and BLB_IN (at about VDD), i.e., the difference is less than a sensing voltage (δV), electrical node BL_IN may be pulled to VDD by PMOS transistor 225 while BLB_IN may be pulled to VSS by NMOS transistor 232. Since a latched version of electrical node BL_IN is the output of asymmetric sense amplifier 200, the output of asymmetric sense amplifier 200 switches to a high value. FIG. 4b illustrates a detailed view of fourth trace 320 within highlight 370, with trace 450 illustrating that electrical nodes BLB_IN and BL_IN are substantially the same voltage potential. Referring now back to FIG. 3, a portion 372 of fourth trace 320 illustrates electrical nodes BL_IN and BLB_IN being pulled to VDD and VSS, respectively.

Referring back now to FIG. 2b, according to an embodiment, channel lengths of PMOS and NMOS transistors in asymmetric sense amplifier 200 may be substantially equal. However, in order to sense a zero (0), channel widths of NMOS transistor 232 and PMOS transistor 212 may be different from channel widths of other PMOS and NMOS transistors in asymmetric sense amplifier 200. Preferably, channel widths of NMOS transistor 232 and PMOS transistor 212 may be larger than channel widths of other PMOS and NMOS transistors in asymmetric sense amplifier 200. In general, widening the channel of a transistor increases the capability of the transistor to handle larger currents, i.e., strengthening the transistor.

Generally, a ratio of channel width of NMOS transistor 232 to other NMOS transistors and a ratio of channel width of PMOS transistor 212 to other PMOS transistors may be dependent on process technology used to fabricate asymmetric sense amplifier 200. However, a possible range for the ratio of channel width of NMOS transistor 232 to other NMOS transistors may be from about 1.1:1 to about 3.5:1, with a default channel width of 1 um, while a possible range for the ratio of channel width of PMOS transistor 212 to other PMOS transistors may be from about 1:1 to about 1.7:1, with a default channel width of 400 nm.

Changing the channel width of NMOS transistor 232 changes the current $I_{D1}$ flowing through the transistor and altering the ratio of $I_{D1}$ to $I_{D0}$, affecting equation (1)

$$\left( \frac{I_{D1}}{I_{D0}} = \frac{(W/L)_1 (V_{DL\_IN} - V_{COM} - V_{THN1})^2}{(W/L)_0 (V_{DLB\_IN} - V_{COM} - V_{THN0})^2} \right).$$

Increasing the channel width of NMOS transistor 232 increases $I_{D1}$ and makes imbalanced cross-coupled latch 205 more imbalanced for detecting a one (1) in a memory cell.

NMOS transistor 232 may be used to pull the electrical node BLB_IN down to VSS (a low value). Therefore, enlarging NMOS transistor 232 may increase the ease in which the electrical node BLB_IN is pulled down to VSS. However, making it easier to pull the electrical node BLB_IN down to VSS may make it more difficult for asymmetric sense amplifier 200 to correctly detect a zero (0) stored in the memory cell, which requires that the electrical node BL_IN to be pulled down to VSS.

FIG. 5a shows a table 500 of the impact of a range of sensing voltages (δV) and a range of channel widths of NMOS transistor 232 on the ability to correctly detect a zero (0) stored in a memory cell. Rows of table 500 represent different sensing voltages (δV) ranging from 5 mV to 90 mV, while columns of table represent different channel widths for NMOS transistor 232 ranging from 1.1 um to 3.5 um. As the channel widths of NMOS transistor 232 are varied from 1.1 um to 3.5 um, the channel widths of other NMOS transistors in asymmetric sense amplifier 200 are maintained at about 1.0 um. For example, row 505 represents an offset voltage (δV) of 90 mV and column 510 represents a channel width of 1.1 um.

Individual cells in table 500 indicate if asymmetric sense amplifier 200 with corresponding sensing voltage (δV) and NMOS transistor 232 channel width is capable of correctly detecting a zero (0) stored in a memory cell. As shown in table 500, as channel widths increase, greater sensing voltages are required to successfully detect a zero (0) stored in a memory cell. For example, with a channel width of 1.1 um, a sensing voltage of 10 mV is required to successfully detect a zero (0) stored in a memory cell. However, for a channel width of 3.5 um, a sensing voltage of 80 mV is required to successfully detect a zero (0) stored in a memory cell. Therefore, improving the detection of a one (1) stored in a memory cell by increasing the channel width of NMOS transistor 232 may result in having to increase the sensing voltage to retain the ability to successfully detect a zero (0).

Referring back now to FIG. 2b, while increasing the channel width of NMOS transistor 232 may improve the ability to detect a one (1) stored in a memory cell, the improved ability to detect a one (1) comes at the expense of detecting a zero (0), it may be possible to counteract the negative impact on the detection of a zero (0) stored in a memory cell resulting from the increase in the channel width of NMOS transistor 232 by increasing the channel width of PMOS transistor 212. Increasing the channel width of PMOS transistor 212 may alter the gate-source voltage of NMOS transistor 230, thereby affecting the ability to detect a zero (0) stored in a memory cell.

FIG. 5b shows a table 550 of the impact of a range of sensing voltages and a range of channel widths of PMOS transistor 212 on the ability to correctly detect a zero (0) stored in a memory cell with the channel width of NMOS transistor 232 fixed at 100 nm. Rows of table 550 represent different sensing voltages (δV) ranging from 2.5 mV to 80 mV, while columns of table represent different channel widths for NMOS transistor 222 ranging from 400 nm to 600 nm. For example, row 555 represents a sensing voltage of 80 mV and column 560 represents a channel width of 400 nm.

Individual cells in table 550 indicate if asymmetric sense amplifier 200 with corresponding sensing voltage and PMOS transistor 212 channel width is capable of correctly detecting a zero (0) stored in a memory cell. As shown in table 520, as channel widths increase, smaller sensing voltages are required to successfully detect a zero (0) stored in a memory cell. For example, with a channel width of 400 nm, a sensing voltage of 45 mV is required to successfully detect a zero (0) stored in a memory cell. However, for a channel width of 600 nm, a sensing voltage of 5 mV is required to successfully detect a zero (0) stored in a memory cell. Therefore, improving the detection of a zero (0) stored in a memory cell may be achieved by increasing the channel width of PMOS transistor 212.

Figure 1A:
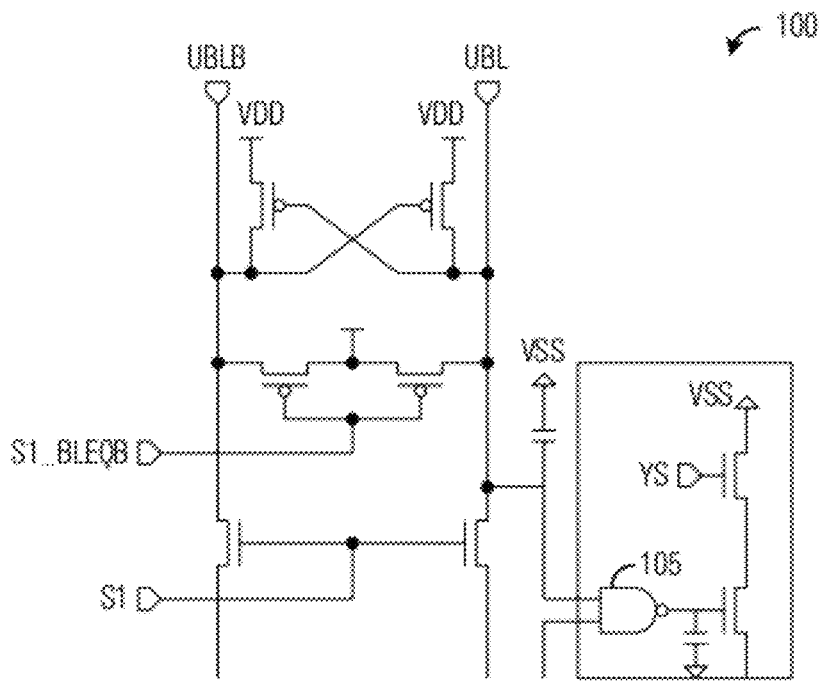
FIG. 1a is a diagram of a prior art sense amplifier utilizing a logic gate to determine the state of a memory cell.
Figure 1B:
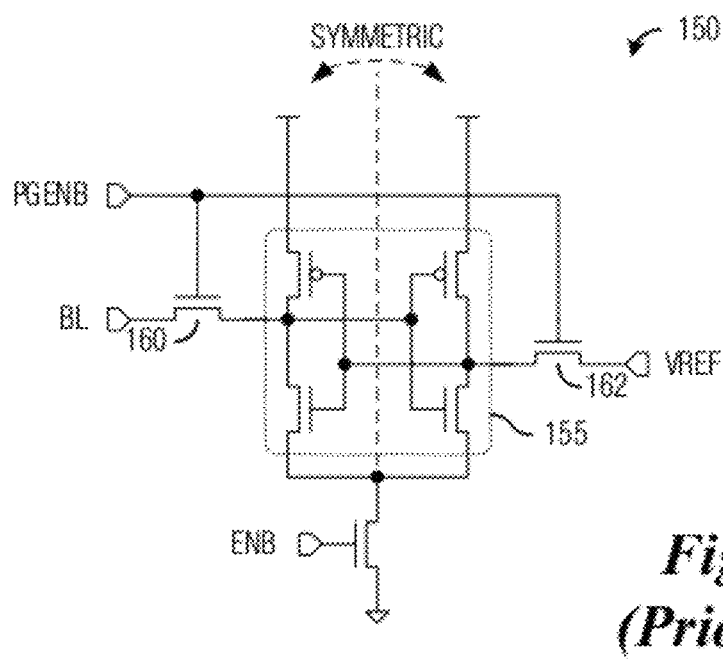
FIG. 1b is a diagram of a prior art single-ended symmetrical differential sense amplifier.

FIG. 6 shows a table 600 comparing prior art single-ended symmetrical differential sense amplifier 150 (FIG. 1b) with embodiments of asymmetric sense amplifier 200. Data shown in table 600 are derived using statistical simulations of prior art single-ended symmetrical differential sense amplifier 150 and asymmetric sense amplifier 200. Rows of table 600 represent different sense amplifier configurations, wherein row 605 displays data for prior art single-ended symmetrical differential sense amplifier 150, and rows 607 and 609 displays data for asymmetric sense amplifier 200 with different channel widths for NMOS transistor 232 and PMOS transistor 212. Columns of table 600 represent different transistor geometry values and sense amplifier offset voltage values, wherein column 610 displays different channel widths for NMOS transistor 232 and PMOS transistor 212 (for prior art single-ended symmetrical differential sense amplifier 150, transistor channel widths are set at a default 1.0 um for NMOS transistors and 520 nm for PMOS transistors), column 615 displays standard deviation values of sense amplifier offset voltage, column 617 displays mean value of sense amplifier offset voltage, and column 619 displays six times standard deviation of sense amplifier offset voltage.

Table 600 shows that asymmetric sense amplifier 200 with a channel width of 1.2 um for NMOS transistor 232 and 620 nm for PMOS transistor 212 has sense amplifier offset voltage values substantially similar to sense amplifier offset voltage values for prior art single-ended symmetrical differential sense amplifier 150 with a mean sense amplifier offset voltage of 12.3721 mV versus 12.6709 mV, a standard deviation in the sense amplifier offset voltage of 9.1425 mV versus 9.3153 mV, and a six times standard deviation in the sense amplifier offset voltage of 54.855 mV versus 55.892 mV.

Figure 7:
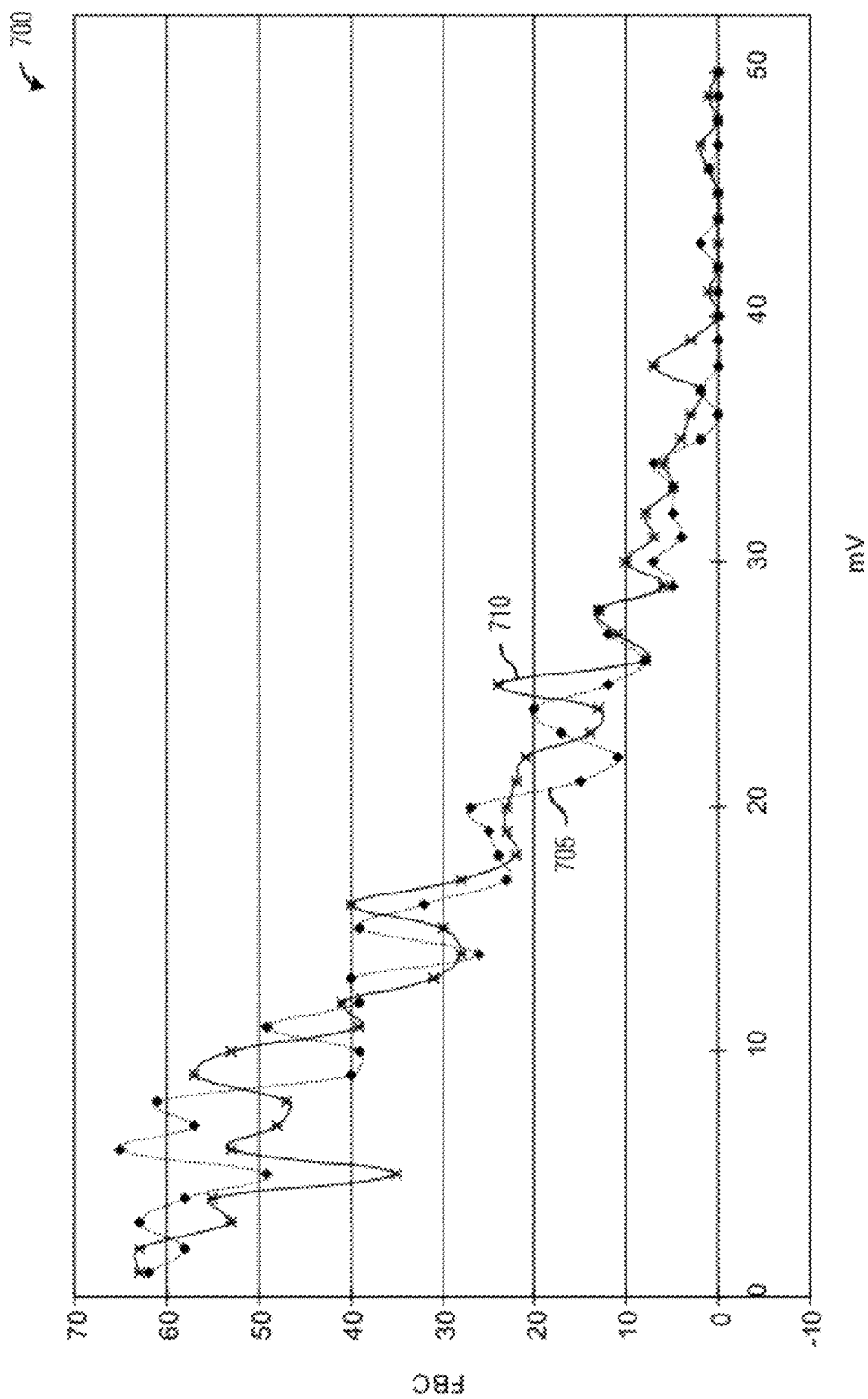
FIG. 7 is a data plot of faulty bit counts versus sense amplifier offset voltage for several different sense amplifier configurations.

FIG. 7 shows a data plot 700 of faulty bit count (FBC) versus sense amplifier offset voltage in mV, with the data obtained through statistical simulation, wherein FBC is a count of times that a value stored in a memory cell is incorrectly detected. A first trace 705 displays results for prior art single-ended symmetrical differential sense amplifier 150 with transistor channel widths are set at a default 1.0 um for NMOS transistors and 520 nm for PMOS transistors and a second trace 710 displays results for asymmetric sense amplifier 200 with channel width of 1.2 um for NMOS transistor 232 and 620 nm for PMOS transistor 212. The traces show that over a range of sense amplifier offset voltages starting at 1 mV to 50 mV, the FBC for the two sense amplifiers are about equal. Data plot 700 may also be used to select a sense amplifier offset voltage from an acceptable FBC, for example.

Figure 8A:
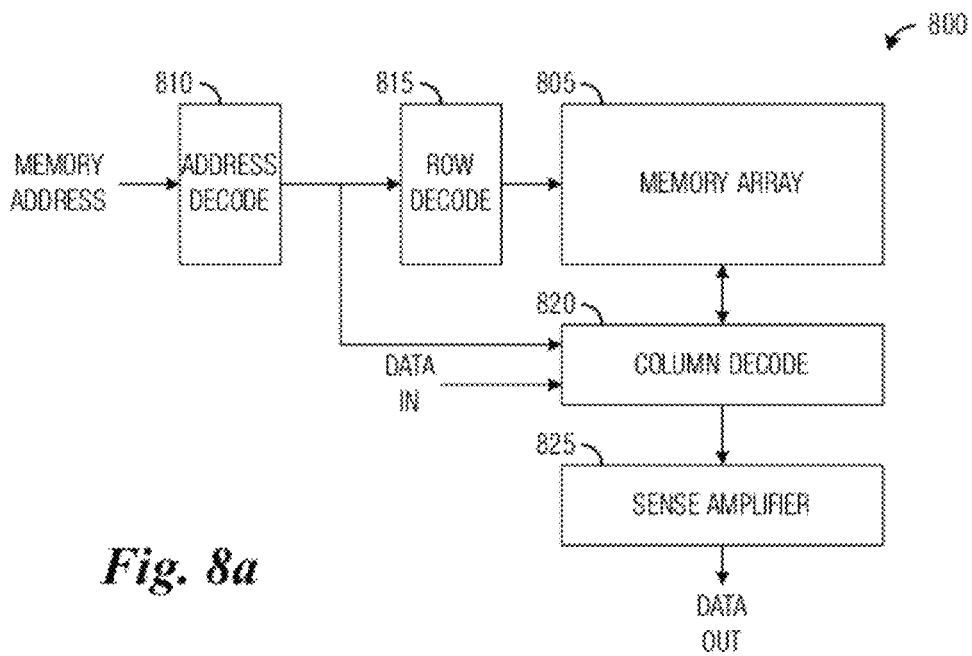
FIG. 8a is a diagram of a memory system.

FIG. 8*a* shows a memory system 800. Memory system 800 includes a memory array 805 used to store information. Generally, memory array 805 contains a large number of individual memory cells arranged in a two-dimensional matrix. Individual memory cells may be addressed by a row number and a column number. Memory system 800 also includes an address decode 810 used to decode a memory address into a row number and a column number. Address decode 810 may directly determine a memory address's row number and column number and provide the row number to a row decode 815 which will select a row in memory array 805. Similarly, a column decode may select a column in memory array 805 based on a column number provided by address decode 810. A sense amplifier 825 may be used to detect information stored in a memory cell specified by the memory address. Sense amplifier 825 may be implemented using asymmetric sense amplifier 200.

Figure 8B:
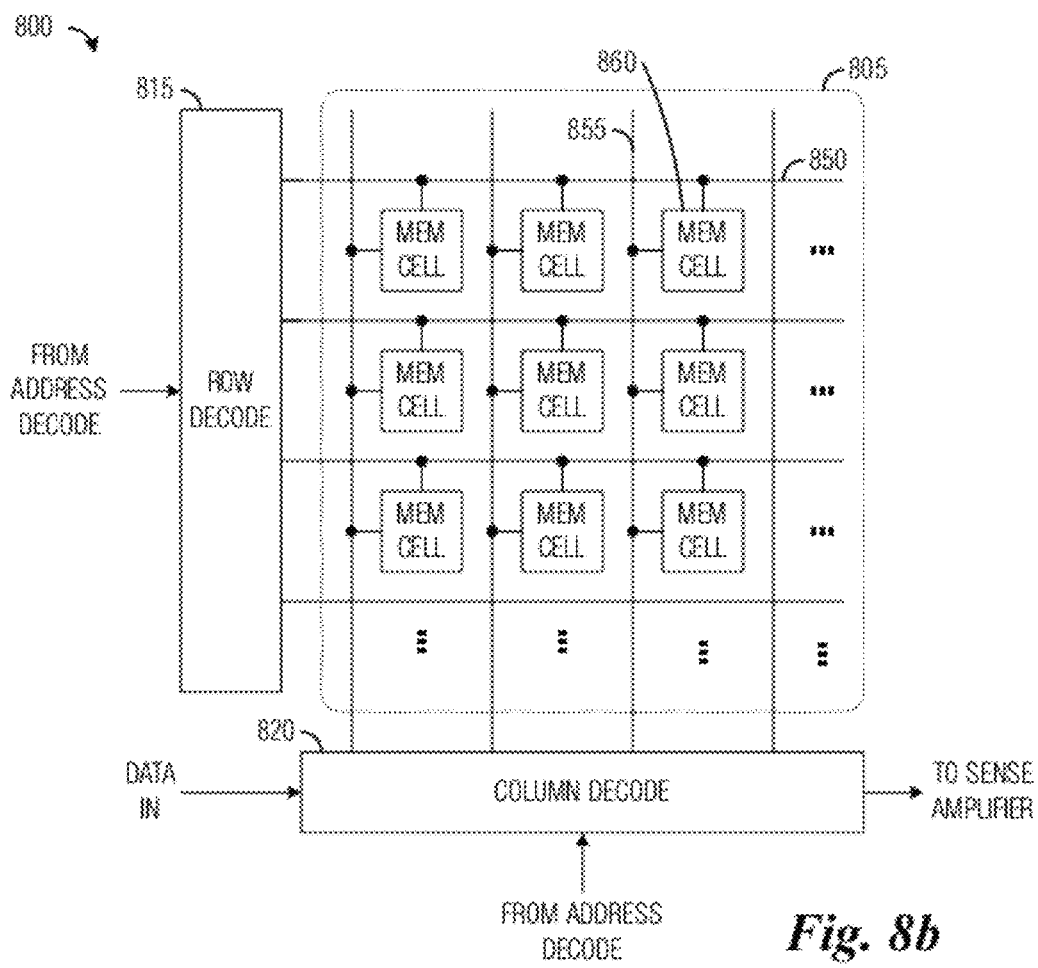
FIG. 8b is a detailed diagram of a portion of a memory system.

FIG. 8*b* shows a detailed view of a portion of memory system 800 with memory array 805 is shown in detail. Memory array 805 comprises a two-dimensional array of memory cells, with each memory cell coupled to a row line and a column line. For example, row line 850 and column line 855 are coupled to memory cell 860. Memory cell 860 may become active when both row line 850 and column line 855 are asserted. Row decode 815 and column decode 820 each assert a single row line and column line, respectively, when provided with a row number and a column number from address decode 810. Information (in the form of an electrical charge) stored in a memory cell may have an effect on a voltage level on a column line. It may be the change on the voltage level of a column line that is detected by a sense amplifier to determine what is stored in the memory cell. Sense amplifier 825 may be able to detect information stored in memory cell 860 through column line 855, for example. Although the discussion discloses the sensing of information stored in a memory cell through a column line, it may also be possible to alter the configuration of memory array 805 to sense information stored in a memory cell using a row line.

In accordance with an embodiment, a sense amplifier is provided. The sense amplifier includes an imbalanced cross-coupled latch (ICL) coupled to a bit line (BL) and a bit line inverse (BLB), a first gate FET with its channel coupled between the BL and the first output node, and a second gate FET with its channel coupled between the BLB and the second output node. The ICL outputs a logic low value if a difference between a value on the BL and a value on the BLB exceeds a threshold and outputs a logic high value if the difference does not exceed the threshold. The ICL includes a first pull down field effect transistor (FET) with its channel coupled between a first output node and electrical ground by way of a channel of an enable FET, and a second pull down FET with its channel coupled between a second output node and electrical ground by way of the channel of the enable FET. A gate terminal of the first pull down FET is coupled to the second output node, a gate terminal of the second pull down FET is coupled to the first output node, and a width of the channel of the second pull down FET is wider than a width of the channel of the first pull down FET. Furthermore, a width of the channel of the second gate FET is wider than a width of the channel of the first gate FET.

In accordance with another embodiment, an asymmetric sense amplifier is provided. The asymmetric sense amplifier includes a first pull up field effect transistor (FET) with its channel coupled between a supply voltage and a first output node, a first pull down FET with its channel coupled between the first output node and electrical ground by way of a channel of an enable FET, and a second pull up FET with its channel coupled between the supply voltage and a second output node. The asymmetric sense amplifier also includes a second pull down FET with its channel coupled between the second output node and electrical ground by way of the channel of the enable FET, a first gate FET with its channel coupled between a data input and the first output node, and a second gate FET with its channel coupled between the supply voltage and the second output node. The asymmetric sense amplifier further includes a first precharge FET with its channel coupled between gate terminals of the first pull up FET and the second pull up FET. Gate terminals of the first pull up FET and the first pull down FET are coupled to the second output terminal, and gate terminals of the second pull up FET and the second pull down FET are coupled to the first output terminal. Also gate terminals of the first gate FET and the second gate FET are coupled to a gate control signal, and a gate terminal of the precharge FET is coupled to a precharge control signal. Additionally, a width of the channel of the second pull down FET is wider than a width of the channel of the first pull down FET, and a width of the channel of the second gate FET is wider than a width of the channel of the first gate FET.

In accordance with another embodiment, a memory device is provided. The memory device includes an array of memory cells coupled to a plurality of row lines and column lines, a row decode coupled to the plurality of row lines, and to an address decode, a column decode coupled to the plurality of column lines, and to the address decode, and a sense amplifier coupled to the column decode. The row decode activates a selected row line decoded from a row address provided by the address decode, and the column decode activates a selected column line decoded from a column address provided by the address decode. The sense amplifier detects a value stored in a memory cell activated by the selected row line and the selected column line, enhances the detection of a one (1) stored in the memory cell by having a first pull down transistor with a channel width that is larger than a second pull down transistor, and enhances the detection of a zero (0) stored in the memory cell by having a first gate transistor with a channel width that is larger than a second gate transistor. The first pull down transistor is coupled to a first data input and the second pull down transistor is coupled to a second data input and the first data input is coupled to a supply voltage and the second data input is coupled to the selected column line, the first gate transistor is coupled to the first data input and the second gate transistor is coupled to the second data input.

In another embodiment, a method is provided. The method entails precharging a first output node and a second output node to a precharge voltage; coupling at least one memory cell to a bit line (BL) and receiving a voltage value representing a stored data on the BL; receiving a voltage on a bit line bar (BLB); and sensing the relative voltage on the BL and the BLB in an imbalanced cross-coupled latch (ICL) and outputting a logic low value if the a difference between the a voltage on the BL and a voltage on the BLB exceeds a threshold, and outputting a logic high value if the difference does not exceed the threshold. In the method, sensing the relative voltage on the BL and the BLB in the ICL includes coupling the BL and BLB to the first and second output nodes and providing at least a first and a second pull down field effect transistor (FET) each having a channel coupled between the first and second output nodes, respectively, and an electrical ground coupled through the channel of an enable FET, each of the first and second pull down FET transistors having a gate coupled to the second and the first output nodes, respectively, in a cross coupled arrangement, and providing at least a first and a second pull up FET each having a channel coupled between a positive supply voltage and the first and second output nodes and each having a gate coupled to the second and first output nodes, respectively, and wherein the second pull down FET has a channel width that is greater than a channel width of the first pull down FET.

In a further embodiment, a method includes coupling a signal on a bit line (BL) and a bit line bar (BLB) into an imbalanced cross-coupled latch (ICL) configured as a sense amplifier through the channels of a first gate FET and a second gate FET, the second gate FET having a channel width greater than the channel width of the first gate FET; precharging a first output node and a second output node to a supply voltage, responsive to a precharge control signal; receiving the BL and BLB voltages on the first output node and the second output node coupled to the ICL, the first output node coupled to a ground supply voltage by the channel of a first pull down FET and an enable FET controlled by a sense enable signal, the second output node coupled to the ground supply voltage by the channel of a second pull down FET and the enable FET controlled by the sense enable signal, a gate terminal of the first pull down FET coupled to the second output node and a gate terminal of the second pull down FET coupled to the first output node, in a cross coupled arrangement, wherein the second pull down FET has a channel width greater than the channel width of the first pull down FET; and enabling the ICL by applying a sense enable signal to the enable FET, the ICL outputting a logic low value if a difference between the voltage on the BL and the BLB exceeds a threshold, and outputting a high value if the difference does not exceed the threshold.

In still a further embodiment, a method includes coupling an array of memory cells to a plurality of row lines and a plurality of column lines; responsive to a column decode activating one of the column lines, receiving a data stored in a memory cell selected by an active row line on a bit line (BL); receiving a voltage on a bit line bar (BLB); and sensing the difference between the voltages on the BL and BLB by coupling the BL to a first output node of an imbalanced cross-coupled latch (ICL) by the channel of a first gate FET, and coupling the BLB to a second output node of the imbalanced cross coupled latch by the channel of a second gate FET, the ICL outputting a logic low value if the a difference between the a voltage on the BL and a voltage on the BLB exceeds a threshold, and outputting a logic high value if the difference does not exceed the threshold. In the method, sensing the difference further includes coupling the first output node to a ground voltage through the channel of a first pull down FET having a first channel width and through the channel of an enable FET, coupling the second output node to the ground voltage through the channel of a second pull down FET having a second channel width greater than the first channel width and through the channel of the enable FET; a gate of the first pull down FET coupled to the second output and a gate of the second pull down FET coupled to the first output to form a cross coupled arrangement, a gate terminal of the enable FET receiving a sense amplifier enable signal.

An advantage of an embodiment is that the time required to sense the state of a memory cell is short, which results in low access times for the semiconductor storage device.

A further advantage of an embodiment is that a reference voltage is not required, which simplifies semiconductor storage device design as well as helps to reduce cost.

Yet another advantage of an embodiment is that the offset voltage is comparable to that of a symmetric sense amplifier.

Although the embodiments and their advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method, comprising:
   precharging a first output node and a second output node to a precharge voltage by coupling a channel of a first pre-charge FET between the first output node and a positive supply voltage; coupling a channel of a second pre-charge FET between second output node and a positive supply voltage, and coupling the channel of a third pre-charge FET between the gates of the first and second pull up FETs and applying a pre-charge control signal to a gate of each of the first, second and third pre-charge FETs;
   coupling at least one memory cell to a bit line (BL) and receiving a voltage value representing a stored data on the BL;
   receiving a voltage on a bit line bar (BLB); and
   sensing a relative voltage between the BL and the BLB in an imbalanced cross-coupled latch (ICL) and outputting a logic low value if a difference between a voltage on the BL and a voltage on the BLB exceeds a threshold, and outputting a logic high value if the difference does not exceed the threshold;
   wherein sensing the relative voltage comprises coupling the BL and BLB to the first and second output nodes and providing at least a first and a second pull down field effect transistor (FET) each having a channel coupled between the first and second output nodes, respectively, and an electrical ground coupled through the channel of an enable FET, each of the first and second pull down FET transistors having a gate coupled to the second and the first output nodes, respectively, in a cross coupled arrangement, and providing at least a first and a second pull up FET each having a channel coupled between a positive supply voltage and the first and second output nodes and each having a gate coupled to the second and first output nodes, respectively, and wherein the second pull down FET has a channel width that is greater than a channel width of the first pull down FET.

2. The method of claim 1, wherein coupling the BL and BLB to the first and second output nodes further comprises coupling the channel of a first gate FET between the BL and the first output node and coupling the channel of a second gate FET between the BLB and the second output node; and applying a gate enable signal to a gate terminal of both the first and second gate FETs; wherein a width of the channel of the second gate FET is greater than a width of the channel of the first gate FET.

3. The method of claim 2, wherein providing the first and second gate FETs comprises providing gate FETs wherein a ratio of a width of the channel of the second gate FET to a width of the channel of the first gate FET ranges from around 1:1 to around 1.7:1.

4. The method of claim 2, wherein providing the second gate FET comprises providing a plurality of gate FETs arranged in parallel.

5. The method of claim 1, wherein providing the first and second pull down FETs further comprises providing FETs wherein a ratio of the width of the channel of the second pull-down FET to the width of the channel of the first pull-down FET ranges from about 1.1:1 to about 3.5:1.

6. The method of claim 1, wherein providing a second pull down FET comprises providing a plurality of pull down FETs arranged in parallel.

7. The method of claim 6, wherein providing each of the plurality of pull down FETs comprises providing pull down FETs arranged in parallel, each having a channel width substantially equal to the width of the channel of the first pull down FET.

8. The method of claim 1, wherein receiving a voltage on the BLB comprises coupling the BLB to a supply voltage.

9. The method of claim 1, wherein the threshold comprises a sense amplifier offset voltage.

10. A method comprising:
coupling a signal on a bit line (BL) and a bit line bar (BLB) into an imbalanced cross-coupled latch (ICL) configured as a sense amplifier through the channels of a first gate FET and a second gate FET, respectively, the second gate FET having a channel width greater than the channel width of the first gate FET;
precharging a first output node and a second output node to a supply voltage, responsive to a pre-charge control signal;
receiving the BL and BLB voltages on the first output node and the second output node coupled to the ICL, the first output node coupled to a ground supply voltage by the channel of a first pull down FET and an enable FET controlled by a sense enable signal, the second output node coupled to the ground supply voltage by the channel of a second pull down FET and the enable FET controlled by the sense enable signal, a gate terminal of the first pull down FET coupled to the second output node and a gate terminal of the second pull down FET coupled to the first output node, in a cross coupled arrangement, wherein the second pull down FET has a channel width greater than the channel width of the first pull down FET; and
enabling the ICL by applying a sense enable signal to the enable FET, the ICL outputting a logic low value if a difference between the voltage on the BL and the BLB exceeds a threshold, and outputting a high value if the difference does not exceed the threshold, wherein the threshold is a sense amplifier offset voltage.

11. The method of claim 10, wherein precharging the first output node and the second output node to a supply voltage further comprises coupling the first output node to the supply voltage through the channel of a first pre-charge FET, having a gate terminal, coupling the second output node to the supply voltage through the channel of a second pre-charge FET, having a gate terminal, and applying a pre-charge control signal to the first and second gate terminals.

12. The method of claim 10, further comprising providing a first pull up FET having a channel coupled between the first output node and a supply voltage, and having a gate terminal, and a second pull up FET having a channel coupled between the second output node and a supply voltage, and having a gate terminal, the gate of the first pull up FET and the gate of the second pull up FET coupled to the second output node and the first output node, respectively, in a cross coupled arrangement, the gates of the first and second pull up FETs further coupled together by a third pre-charge transistor.

13. The method of claim 10, further comprising coupling the BLB to a supply voltage.

14. A method, comprising:
coupling an array of memory cells to a plurality of row lines and a plurality of column lines;
precharging first and second output nodes of an imbalanced cross-coupled latch (ICL) by coupling the first output node to a supply voltage through the channel of a first pre-charge FET having a pre-charge control signal at a gate terminal and coupling the second output node to the supply voltage through the channel of a second pre-charge FET having the pre-charge control signal at its gate terminal, and applying the pre-charge control signal;
responsive to a column decode activating one of the column lines, receiving a data stored in a memory cell selected by an active row line on a bit line (BL);
receiving a voltage on a bit line bar (BLB); and
sensing the difference between the voltages on the BL and BLB by coupling the BL to the first output node of the imbalanced cross-coupled latch (ICL) by the channel of a first gate field effect transistor (FET), and coupling the BLB to the second output node of the imbalanced cross coupled latch by the channel of a second gate FET, the ICL outputting a logic low value if a difference between a voltage on the BL and a voltage on the BLB exceeds a threshold, and outputting a logic high value if the difference does not exceed the threshold;
wherein sensing the difference further comprises coupling the first output node to a ground voltage through the channel of a first pull down FET having a first channel width and through the channel of an enable FET, coupling the second output node to the ground voltage through the channel of a second pull down FET having a second channel width greater than the first channel width and through the channel of the enable FET; a gate of the first pull down FET coupled to the second output and a gate of the second pull down FET coupled to the first output to form a cross coupled arrangement, a gate terminal of the enable FET receiving a sense amplifier enable signal.

15. The method of claim 14, further comprising coupling the BLB to a voltage supply signal.

16. The method of claim 14, wherein sensing further comprises coupling the first output node to a positive voltage supply through the channel of a first pull up FET and coupling the second output node to a positive voltage supply through the channel of a second pull up FET, a gate of the first pull up FET and a gate of the second pull up FET coupled to the second and to the first outputs, respectively, in a cross-coupled arrangement.

17. The method of claim 14, wherein the channel width of the second gate FET is greater than the channel width of the first gate FET.

* * * * *